United States Patent [19]
Jacobs et al.

[11] Patent Number: 6,096,578
[45] Date of Patent: Aug. 1, 2000

[54] STRESS RELIEF MATRIX FOR INTEGRATED CIRCUIT PACKAGING

[75] Inventors: Elizabeth G. Jacobs, Richardson; Katherine G. Heinen, Dallas, both of Tex.

[73] Assignee: Texas Instruments Incorporated, Dallas, Tex.

[21] Appl. No.: 09/234,689

[22] Filed: Jan. 21, 1999

Related U.S. Application Data

[62] Division of application No. 08/964,513, Nov. 5, 1997, Pat. No. 5,894,173.

[51] Int. Cl.[7] ............................................. H01L 21/44
[52] U.S. Cl. .................................... 438/118; 438/119
[58] Field of Search .................................... 438/118, 119

[56] References Cited

U.S. PATENT DOCUMENTS

| | | | |
|---|---|---|---|
| 4,825,284 | 4/1989 | Soga et al. | 257/778 |
| 4,886,686 | 12/1989 | Muenstedt | 428/156 |
| 5,364,669 | 11/1994 | Sumida et al. | 428/1.5 |
| 5,553,769 | 9/1996 | Ellerson et al. | 228/123.1 |
| 5,589,236 | 12/1996 | Harvey et al. | 428/480 |
| 5,611,140 | 3/1997 | Kulesza et al. | 438/119 |
| 5,656,551 | 8/1997 | Corbett et al. | 438/118 |
| 5,659,203 | 8/1997 | Call et al. | 257/778 |
| 5,709,960 | 1/1998 | Mays | 428/698 |
| 5,783,465 | 7/1998 | Canning et al. | 438/118 |
| 5,786,238 | 7/1998 | Pai et al. | 438/118 |
| 5,863,815 | 1/1999 | Egawa | 438/118 |

OTHER PUBLICATIONS

Article from IEPS Conference, 1994, "Flip Chip Attachment Using Non–Conductive Adhesives and Gold Ball Bumps", pp. 794–807 (R. Aschenbrenner, J. Gwiasda, J. Eldring, E. Zakel and H. Reichl).

Article from IEEE, 1992, "Direct Chip Interconnect With Adhesive–Connector Films,"pp. 487–491 (Nagesh R. Basavanhally, David D. Chang, Benjamin H. Cranston).

Interpak 95 Proceedings, Hawaii, Mar. 1995, Reworkable Encapsulation for Flip–Chip Packaging, (Frank L. Pompeo, Anson J. Call, Jeffrey T. Coffin).

*Primary Examiner*—Kevin M. Picardat
*Attorney, Agent, or Firm*—Jacqueline J. Garner; Wade James Brady, III; Richard L. Donaldson

[57] ABSTRACT

An integrated circuit package (10, 40) may comprise an integrated circuit chip (12, 42) and a substrate (14, 44) opposite the chip (12, 42). A connector (20, 52) may be disposed between the chip (12, 42) and the substrate (14, 44) to electrically couple the chip (12, 42) and the substrate (14, 44). A matrix (24, 50) may be disposed about the connector (20, 52). The matrix (24, 50) may comprise a blend of liquid crystal polymer and thermoplastic polymer. The matrix (24, 50) may have a coefficient of thermal expansion in a direction (26, 56) substantially parallel to the chip (12, 42) and the substrate (14, 44) that is greater than that of the chip (12, 42) and that is less than that of the substrate (14, 44) in the substantially parallel direction (26, 56). In a direction (28, 58) normal to the substantially parallel direction (26, 56), the matrix (24, 50) may have a coefficient of thermal expansion that is approximately that of the connector (20, 52).

24 Claims, 1 Drawing Sheet

6,096,578

STRESS RELIEF MATRIX FOR INTEGRATED CIRCUIT PACKAGING

This is a divisional application of Ser. No. 08/964,513 filed Nov. 5, 1997, now U.S. Pat. No. 5,894,173.

TECHNICAL FIELD OF THE INVENTION

This invention relates generally to integrated circuit packaging, and more particularly to a stress relief matrix for an integrated circuit package and method.

BACKGROUND OF THE INVENTION

To facilitate installment of integrated circuit chips, the chips are typically packaged. The packaging provides leads for connecting chips to external devices and protection from environmental factors. For example, the packaging serves to protect the chip from exposure to contaminants, which could cause damage to the circuit components.

Packaging technology such as flip chip rely on bumps for interconnection between a chip and a substrate. The bumps may be formed by evaporation, by plating of solder, gold or copper, screening conductive paste or by forming ball bonds. A problem with the use of such bumps is that the interface between the bumps and the substrate or chip is vulnerable to failure during thermal cycling as a result of mechanical stress at the interface generated by differences in thermal expansion coefficients of the chip and the substrate. Thermal expansion may be caused by a number of factors including heat generated by the flow of electricity within the circuitry of the integrated circuit chip, environmental factors such as ambient temperature, and heating and cooling cycles caused by power on and off cycles of the chip.

To reduce temperature induced failure of integrated circuit chips, underfill has been used at the interface between the chip and the substrate.

SUMMARY OF THE INVENTION

Accordingly, a need has arisen in the art for an improved integrated circuit package. The present invention provides an integrated circuit package having an improved stress relief matrix that substantially eliminates or reduces the disadvantages and problems associated with prior packages.

In accordance with the present invention, an integrated circuit package may comprise an integrated circuit chip and a substrate opposite the chip. A connector may be disposed between the chip and the substrate. The connector may electrically couple the chip to the substrate. A matrix may be disposed about the connector. The matrix may comprise a blend of liquid crystal polymer and thermoplastic polymer. The matrix may have a coefficient of thermal expansion in a direction substantially parallel to the chip and the substrate that is greater than that of the chip and that is less than that of the substrate in the substantially parallel direction. The matrix may have a coefficient of thermal expansion in a direction normal to the substantially parallel direction that is approximately that of the connector in the normal direction.

More specifically, in accordance with one embodiment of the present invention, the matrix may have a coefficient of thermal expansion in the substantially parallel direction of between 8 and 12 ppm/°C. The matrix may have a coefficient of thermal expansion in the normal direction of between 20 and 30 ppm/°C. Additionally, the matrix may have a low moisture absorption rate of less than 0.1% at 85° C./80% RH.

Important technical advantages of the present invention include providing an improved integrated circuit package. In particular, the package includes an improved stress relief matrix comprising a blend of liquid crystal polymer and thermoplastic polymer. The blend has good dimensional stability due to improved mechanical properties and very low moisture absorption. Accordingly, failure of the interconnect between the chip and the substrate is greatly reduced or eliminated.

Another important technical advantage of the present invention includes providing a stress relief matrix in the form of a preformed film. In particular, the blend may be processed to form a solid film for use in the packaging process. The film may be cut to the size of an integrated circuit chip. Accordingly, liquid processing problems such as void formation, incomplete or non-uniform coverage of area, and inadequate flow viscosity may be avoided. Additionally, special equipment needed to keep liquid and/or paste in a confined space is no longer needed and a chip size package may be produced.

Still other technical advantages of the present invention include providing a reworkable integrated circuit package. The blend of the present invention is thermoplastic, not thermosetting. Accordingly, an integrated circuit package may be reheated and then reworked.

Other technical advantages will be readily apparent to one skilled in the art from the following figures, descriptions, and claims.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
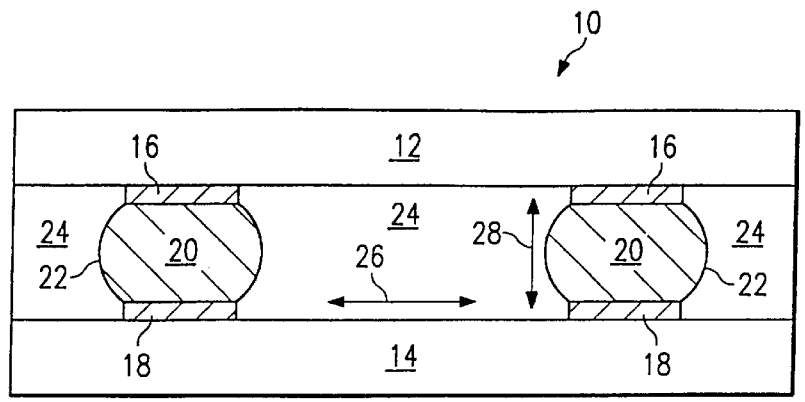
FIG. 1 is a schematic cross-sectional diagram illustrating an integrated circuit package in accordance with one embodiment of the present invention.
Figure 2:
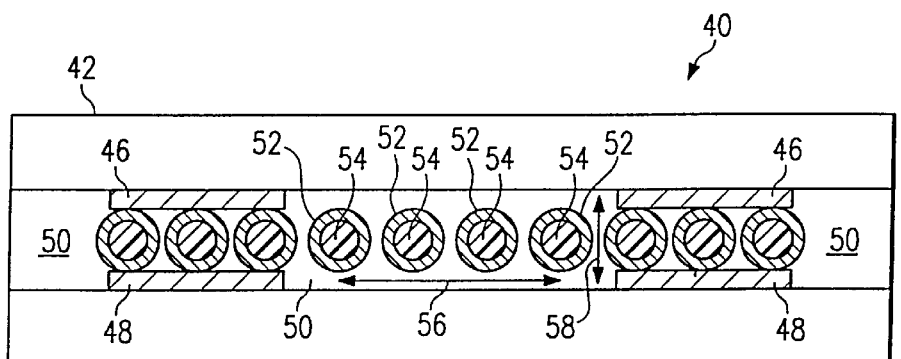
FIG. 2 is a schematic cross-sectional diagram illustrating an integrated circuit package in accordance with another embodiment of the present invention.
Figure 3:
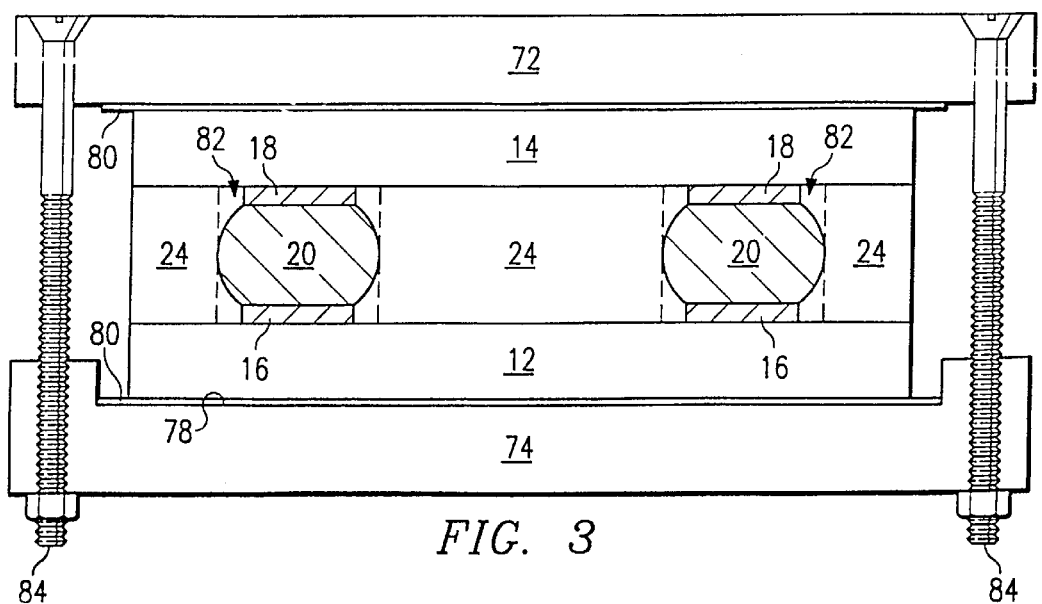
FIG. 3 is a schematic cross-sectional diagram illustrating a jig for packaging the integrated circuit of FIG. 1 in accordance with one embodiment of the present invention.

The preferred embodiments of the present invention and its advantages are best understood by referring now in more detail to FIGS. 1–3 of the drawings, in which like numerals are to like parts throughout the several views. As described in detail below, the present invention provides an improved stress relief matrix for an integrated circuit package. The stress relief matrix comprises a blend of liquid crystal polymer and thermoplastic polymer. The stress relief matrix has good dimensional stability due to improved mechanical properties and very low moisture absorption. Accordingly, the matrix greatly reduces or eliminates failure of interconnects of the integrated circuit package.

FIG. 1 illustrates an integrated circuit package 10. The integrated circuit package 10 may comprise an integrated circuit chip 12 opposite a substrate 14. The integrated circuit chip 12 may include one or more chip bonding pads 16 facing the substrate 14. The chip bonding pads 16 may each be electrically coupled to the integrated circuit chip 12 by a metal trace or the like.

The substrate 14 may be an interposer disposed between the integrated circuit chip 12 and a printed circuit board or the like. In this embodiment, the interposer may reroute electrical contacts of the integrated circuit chip 12 to a different location for connection to a printed circuit board. The interposer may comprise Kapton tape, FR-4 material, BT resin material, or the like. It will be understood that the substrate 14 may be another type of layer capable of receiving electrical contacts of the integrated circuit chip 12. For example, the substrate 14 may be an integrated circuit board.

The substrate 14 may include one or more substrate bonding pads 18 opposite the chip bonding pads 16 of the integrated circuit chip 12. The substrate bonding pads 18 may be electrically coupled to a lead, printed circuit or the like of the substrate 14. The bonding pads 16 and 18 are shown exaggerated for the conveyance of the reader. Typically, the chip bonding pads 16 comprise aluminum or aluminum plus a deposition of layers of metal that will give a bondable surface. The substrate bonding pads 18 typically comprise copper and gold.

A connector 20 may be disposed between integrated circuit chip 12 and the substrate 14 to electrically couple the integrated circuit chip 12 to the substrate 14. The connectors 20 may be conducting bumps, wires, metal particles, metal flakes, or the like electrically coupled to the chip bonding pad 16 and the opposing substrate bonding pad 18. In one embodiment, the conducting bump may be a solder ball 22 soldered to the bonding pads 16 and 18. In this embodiment, the solder ball 22 may conventionally comprise lead and tin solder. It will be understood that the connector 20 may be another type of element capable of electrically coupling the chip bonding pad 16 to the opposing substrate bonding pad 18.

A stress relief matrix 24 may be disposed about the connectors 20 between the integrated circuit chip 12 and the substrate 14. The stress relief matrix 24 may be thermally and/or mechanically adhered to the chip 12, the connectors 20 and the substrate 14. The stress relief matrix 24 protects the connectors 20 from stresses caused by differences in thermal expansion of the integrated circuit chip 12 and the substrate 14. Thermal expansion of the integrated circuit chip 12 is largely governed by the expansion characteristics of silicon, which typically has a coefficient of thermal expansion on the order of about 3 ppm/°C. Typically, the substrate 14, whether an interposer, printed circuit board or the like, has a coefficient of thermal expansion of between 15 and 20 ppm/°C. Accordingly, the integrated circuit chip 12 and substrate 14 may have a difference in thermal expansion of between 12 and 17 ppm/°C.

In accordance with the present invention, the stress relief matrix 24 may comprise a blend of liquid crystal polymer and thermoplastic polymer. Blending a liquid crystal polymer with a conventional thermoplastic polymer results in a material with properties intermediate to the two individual polymers. For example, adding liquid crystal polymer to a thermoplastic polymer can reduce thermal expansion and moisture absorption, and increase dimension stability and elastic modulus of the blend over that of the thermoplastic polymer. In the blend, the thermoplastic polymer may provide increased thermal expansion and moisture absorption, and reduced elastic modulus as compared to the liquid crystal polymer. Accordingly, the properties of the stress relief matrix 24 may be engineered by controlling the blend of liquid crystal polymer and thermoplastic polymer. Properties of the blend generally correspond to the properties of the liquid crystal polymer and the thermoplastic polymer in relation to their ratios in the blend.

In one embodiment, the stress relief matrix 24 may have a coefficient of thermal expansion in a direction 26 substantially parallel to the chip 12 and the substrate 14, which is within the plane of the matrix, that is greater than the coefficient of thermal expansion of the chip 12 in the direction 26 and that is less than the coefficient of thermal expansion of the substrate 14 in the direction 26. In this embodiment, the matrix 24 may have a coefficient of thermal expansion in a direction 28 substantially normal to the direction 26 that is approximately that of the connector 20 in the direction 28.

In a particular embodiment, the liquid crystal polymer may be ZENITE manufactured by DUPONT and the thermoplastic may be a thermoplastic polyimide such as AURUM PL500M manufactured by MITSUI TOATSU CHEMICALS. In this embodiment, the blend may comprise 5–30 percent ZENITE and 95–70 percent AURUM PL500M. It will be understood that other blends of liquid crystal polymer and thermoplastic polymer may be used for the stress relief matrix of the present invention. The resulting matrix 24 may have a coefficient of thermal expansion in the direction 26 of between 20 and 30 ppm/°C. The matrix 24 may have a coefficient of thermal expansion in the direction 28 of between 8 and 12 ppm/°C. Thus, the matrix 24 will expand intermediate to the chip 12 and substrate 14 in the direction 26 and with the connectors 20 in the direction 28 to provide stress relief for the connectors 20. Accordingly, the matrix 24 will protect the connectors 20 from disconnects.

Additionally, the matrix 24 may have a moisture absorption rate of less than 0.1% at 85° C./85%RH. The low moisture absorption will minimize swelling of the matrix 24 between the chip 12 and the substrate 14. Accordingly, the low moisture absorption will prevent separation of the connectors 20 from the bond pads 16 and 18. Such separation will result in a loss of the electrical connection.

The matrix 24 may be blended using melt processing or other well known techniques. The desired amounts of liquid crystal polymer and thermoplastic polymer may be determined by weight. For melt processing, the selected amounts of liquid crystal polymer and thermoplastic polymer may then be melted, mixed, and extruded at different temperatures.

The extruded blend may be rolled into a film having a uniform thickness. In one embodiment, the film may have a thickness proximate to the distance between the chip 12 and the substrate 14. This allows the film to be cut into sections sized and shaped to fill the space around the connectors 20 between the integrated circuit chip 12 and the substrate 14. Accordingly, liquid processing problems such as void formation, incomplete or nonuniform coverage of area, and inadequate flow viscosity may be avoided. Additionally, special equipment needed to keep liquid and/or paste in a confined space need not be used.

FIG. 2 illustrates an integrated circuit package 40 in accordance with another embodiment of the present invention. The integrated circuit package 40 may comprise an integrated circuit chip 42 opposite a substrate 44. The integrated circuit chip 42 may include one or more chip bonding pads 46 electrically coupled to the integrated circuit chip 42. Similarly, the substrate 44 may include one or more substrate bonding pads 48 electrically coupled to the substrate 44. As previously described in connection with the substrate 14, the substrate 44 may be an interposer, printed circuit board, or the like.

A stress relief matrix 50 may include a series of connectors 52 electrically coupling the integrated circuit chip 42 to the substrate 44. The connectors 52 may be randomly distributed through the stress relief matrix 50. The stress relief matrix 50 may be thermally and/or mechanically adhered to the chip 42, the connectors 52 and the substrate 44. The connectors 52 may be conducting bumps, wires, metal particles, metal flakes, or the like electrically coupled to the bonding pads 46 and 48. In one embodiment, the conducting bumps may each comprise a metal coated plastic sphere 54.

The stress relief matrix 50 may be constructed as previously described in connection with the stress relief matrix 24. Accordingly, the stress relief matrix 50 may comprise a blend of liquid crystal polymer and thermoplastic polymer. In one embodiment, the stress relief matrix 50 may have a coefficient of thermal expansion in a direction 56 substantially parallel to the chip 42 and the substrate 44, which is within the plane of the matrix, that is greater than the coefficient of thermal expansion of the chip 42 in the direction 56 and that is less than the coefficient of thermal expansion of the substrate 44 in the direction 56. In this embodiment, the matrix 50 may have a coefficient of thermal expansion in a direction 58 substantially normal to the direction 56 that is approximately that of the connector 52 in the direction 58.

In a particular embodiment, the liquid crystal polymer may be ZENITE manufactured by DUPONT and the thermoplastic may be amorphous AURUM PL500M manufactured by MITSUI TOATSU CHEMICALS. In this embodiment, the blend may comprise 5–30 percent ZENITE and 95–70 percent AURUM PL500M. It will be understood that other blends of liquid crystal polymer and thermoplastic polymer may be used for the stress relief matrix of the present invention. The resulting matrix 50 may have a coefficient of thermal expansion in the direction 56 of between 20 and 30 ppm/°C. The matrix 24 may have a coefficient of thermal expansion in the direction 58 of between 8 and 12 ppm/°C. Thus, the stress relief matrix 50 will expand with the connectors 52 in the direction 58 and will expand intermediate of the chip 42 and the substrate 44 in the direction 56 to provide stress relief for the connectors 52. Accordingly, the matrix 24 will protect the connectors 20 from disconnects.

Additionally, the stress relief matrix 50 may have a moisture absorption rate of less than 0.1% at 85° C./85%RH. The low moisture absorption will minimize swelling of the matrix 24 between the chip 12 and the substrate 14. Accordingly, the low moisture absorption will prevent separation of the connectors 20 from the bond pads 16 and 18. Such separation will result in a loss of the electrical connection.

The matrix 50 may be blended using melt processing as previously described in connection with the matrix 24. The blend may be rolled into a film having a uniform thickness and the metal coated plastic sphere 54 added to the film. As previously described, the film may have a thickness proximate to the distance between the chip and the substrate. This allows the film to be cut into sections sized and shaped to fill the space between the chip and the substrate.

FIG. 3 illustrates a jig 70 for packaging integrated circuit chips with the stress relief matrix of the present invention. The jig 70 may be constructed of stainless steel. The jig 70 may have a top 72 and a bottom 74. The bottom 74 may have a recess 78 for receiving the integrated circuit chip 12. A low friction film 80 may be provided in the recess 78 and on top of the substrate 14. The low friction film 80 may allow the top 72 and the bottom 74 of the jig 70 to expand during thermal treatment without stressing the integrated circuit chip 12 or the substrate 14. In one embodiment, the low friction film 80 may be a polyimide film such as Kapton. It will be understood that other types of friction reducing films may be used within the scope of the present invention.

The integrated circuit chip 12 may be packaged by soldering connectors 20 to the chip bonding pads 16. As previously described, the stress relief matrix 24 may comprise a blend of liquid crystal polymer and thermoplastic polymer. The stress relief matrix 24 may be a preformed film sized and shaped to fill the space around the connectors 20 between the integrated circuit chip 12 and the substrate 14. In one embodiment, the preformed film may be the size of the chip 12. In this embodiment, liquid processing problems such as void formation, incomplete or nonuniform coverage of area, and inadequate flow viscosity may be avoided. Additionally, special equipment needed to keep liquid and/or paste in a confined space is no longer needed and a chip sized package may be produced.

Holes 82 may be punched or otherwise formed in the stress relief matrix 24 to receive the connectors 20. The stress relief matrix 24 may then be disposed on the integrated circuit chip 12. The substrate 14 may be disposed in the recess 76 with the substrate bonding pads 18 facing the stress relief matrix 24 and the chip bonding pads 16.

The jig 70 may then be closed using screws. It will be understood that other types of closure mechanisms may be used instead of the screws 84 within the scope of the present invention. Additionally, although only two screws 84 are shown in FIG. 3, the jig 70 may comprise additional screws where necessary to put even pressure on the stress relief matrix 24 between the integrated circuit chip 12 and the substrate 14.

The jig 70 may be thermally treated to bond the stress relief matrix 24 to the integrated circuit chip 12 and the substrate 14. In one embodiment, the integrated circuit chip 12, matrix 24 and substrate 14 may be thermally treated at a temperature between 250 and 300° C. and a pressure of between 200 and 400 psi for a period of between 5 and 15 minutes. The temperature may be ramped up over a period of 45 minutes and ramped down over a period of 2 hours to prevent deformities from forming in the stress relief matrix 24. Processes will be significantly dependent on the thermoplastic component of the matrix.

During thermal treatment, the stress relief matrix 24 will thermally and/or mechanically adhere to the integrated circuit chip 12 and the substrate 14. Accordingly, the matrix 24 provides stress relief for the connectors 20 of the integrated circuit package 10 during thermal cycles. Additionally, solder connectors 20 may reflow and bond with the substrate bonding pads 18. In this embodiment, the matrix 24 should be compatible with solder reflow.

The integrated circuit chip 42 of FIG. 2 may be packaged using essentially the same process as that for integrated circuit chip 12. In this embodiment, however, the connectors 52 may be included in the preformed film of the stress relief matrix 50. A top and a bottom of each connector 52 may be exposed from the preformed film for good contact with the bonding pads 56 and 58 of the integrated circuit chip 42 and the substrate 44. The integrated circuit chip 42, stress relief matrix 50 and substrate 44 may be disposed and thermally treated in the jig 70 as previously described above in connection with FIG. 3 to thermally and/or mechanically adhere the matrix 50 to the chip 12 and the substrate 14.

Although the present invention has been described with several embodiments, various changes and modifications may be suggestive to one skilled in the art. It is intended that the present invention encompass such changes and modifications as fall within the scope of the appended claims.

What is claimed is:

1. A method of packaging integrated circuit chips, comprising the steps of:
   providing an integrated circuit chip and a substrate, each of said integrated circuit chip and said substrate having a surface facing the other of said integrated circuit chip and said substrate;
   disposing a matrix between said integrated circuit chip and said substrate, the matrix comprising a mixture of liquid crystal polymer and thermoplastic polymer;
   pressing both the integrated circuit chip and the substrate against the matrix;
   electrically coupling the integrated circuit chip to the substrate with a connector; and
   under pressure, thermally treating the chip, the matrix and the substrate to adhere the matrix to the integrated circuit chip and to the substrate.

2. The method of claim 1 wherein said matrix includes a plurality of connectors randomly distributed therein for electrically coupling said integrated circuit chip to said substrate.

3. The method of claim 1 wherein said mixture of said liquid crystal polymer and said thermoplastic polymer is a substantially homogeneous mixture.

4. The method of claim 1, wherein the matrix has a moisture absorption rate of less than 0.1% at 85° C./85%RH.

5. The method of claim 4 wherein said matrix includes a plurality of connectors randomly distributed therein for electrically coupling said integrated circuit chip to said substrate.

6. The method of claim 4 wherein said mixture of said liquid crystal polymer and said thermoplastic polymer is a substantially homogeneous mixture.

7. The method of claim 1, wherein the step of thermally treating the chip, matrix and substrate under pressure comprises treating the chip, matrix and substrate at a temperature of between 250 to 330° C. and pressure of between 200 and 400 psi for between 5 and 15 minutes.

8. The method of claim 7 wherein said matrix includes a plurality of connectors randomly distributed therein for electrically coupling said integrated circuit chip to said substrate.

9. The method of claim 7 wherein said mixture of said liquid crystal polymer and said thermoplastic polymer is a substantially homogeneous mixture.

10. The method of claim 1, wherein the matrix is a preformed film.

11. The method of claim 10 wherein said matrix includes a plurality of connectors randomly distributed therein for electrically coupling said integrated circuit chip to said substrate.

12. The method of claim 10 wherein said mixture of said liquid crystal polymer and said thermoplastic polymer is a substantially homogeneous mixture.

13. The method of claim 1, wherein the matrix has a coefficient of thermal expansion in a direction substantially parallel to the chip and the substrate that is greater than that of the chip in the substantially parallel direction and that is less than that of the substrate in the substantially parallel direction.

14. The method of claim 13 wherein said matrix includes a plurality of connectors randomly distributed therein for electrically coupling said integrated circuit chip to said substrate.

15. The method of claim 13 wherein said mixture of said liquid crystal polymer and said thermoplastic polymer is a substantially homogeneous mixture.

16. The method of claim 13, wherein the coefficient of thermal expansion of the matrix in the substantially parallel direction is between 8 and 12 ppm/°C.

17. The method of claim 16 wherein said matrix includes a plurality of connectors randomly distributed therein for electrically coupling said integrated circuit chip to said substrate.

18. The method of claim 16 wherein said mixture of said liquid crystal polymer and said thermoplastic polymer is a substantially homogeneous mixture.

19. The method of claim 13, wherein the matrix has a coefficient of thermal expansion in a direction normal to the substantially parallel direction that is approximately that of the connector in the normal direction.

20. The method of claim 19 wherein said matrix includes a plurality of connectors randomly distributed therein for electrically coupling said integrated circuit chip to said substrate.

21. The method of claim 19 wherein said mixture of said liquid crystal polymer and said thermoplastic polymer is a substantially homogeneous mixture.

22. The method of claim 19, wherein the coefficient of thermal expansion of the matrix in the normal direction is between 20 and 30 ppm/°C.

23. The method of claim 22 wherein said matrix includes a plurality of connectors randomly distributed therein for electrically coupling said integrated circuit chip to said substrate.

24. The method of claim 22 wherein said mixture of said liquid crystal polymer and said thermoplastic polymer is a substantially homogeneous mixture.

* * * * *